United States Patent
Chen et al.

(10) Patent No.: US 8,597,968 B2
(45) Date of Patent: Dec. 3, 2013

(54) ACTIVE DEVICE ARRAY SUBSTRATE

(75) Inventors: Yu-Cheng Chen, Hsinchu (TW);
Chen-Yueh Li, Taichung (TW);
Ching-Sang Chuang, Hsinchu (TW);
Ching-Chieh Shih, Kinmen County (TW); An-Thung Cho, Hualien County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/353,328

(22) Filed: Jan. 19, 2012

(65) Prior Publication Data

US 2012/0112214 A1    May 10, 2012

Related U.S. Application Data

(63) Continuation of application No. 12/559,506, filed on Sep. 15, 2009, now Pat. No. 8,148,185.

(30) Foreign Application Priority Data

Apr. 17, 2009  (TW) .............................. 98112811 A

(51) Int. Cl.
*H01L 21/00*  (2006.01)

(52) U.S. Cl.
USPC .................. 438/34; 438/30; 438/59; 438/151; 438/158; 257/E21.002; 257/E21.414; 257/E29.169; 257/E29.293; 257/E45.001; 257/E51.001

(58) Field of Classification Search
USPC .......... 438/23, 24, 29, 30, 34, 149, 151, 155, 438/158; 257/E27.111, E21.411, E21.414, 257/E21.158, 7, 414, 169, 291, 293, 294, 257/E21.002, E29.169, E29.293, E45.001, 257/E51.001, E51.005

See application file for complete search history.

(56) References Cited

U.S. PATENT DOCUMENTS

| | | | | |
|---|---|---|---|---|
| 5,825,439 A | * | 10/1998 | Noriyama | 349/54 |
| 7,456,909 B2 | * | 11/2008 | Park | 349/40 |
| 2002/0145116 A1 | * | 10/2002 | Choo et al. | 250/370.09 |
| 2004/0262611 A1 | * | 12/2004 | Lai | 257/72 |
| 2006/0231846 A1 | * | 10/2006 | Hong et al. | 257/79 |
| 2009/0009675 A1 | * | 1/2009 | Cho et al. | 349/43 |
| 2009/0280606 A1 | * | 11/2009 | Shih et al. | 438/155 |

FOREIGN PATENT DOCUMENTS

| | | | |
|---|---|---|---|
| KR | 2006043040 A | * | 5/2006 |
| TW | 200604668 | | 2/2006 |

OTHER PUBLICATIONS

"Office Action of Taiwan Counterpart Application", issued on Aug. 28, 2012, p. 1-p. 9.

* cited by examiner

*Primary Examiner* — Ermias Woldegeorgis
(74) *Attorney, Agent, or Firm* — Jianq Chyun IP Office

(57) ABSTRACT

An active device array substrate is provided. First, a substrate having a display area and a sensing area is provided. Then, a first patterned conductor layer is disposed on the display area of the substrate. A gate insulator is disposed on the substrate. A patterned semiconductor layer, a second patterned conductor layer and a patterned photosensitive dielectric layer are disposed on the gate insulator, wherein the second patterned conductor layer includes a source electrode, a drain electrode and a lower electrode, the patterned photosensitive dielectric layer covering the second patterned conductor layer includes an interface protection layer disposed on the source electrode and the drain electrode and a photo-sensing layer disposed on the lower electrode. A passivation layer is then disposed on the substrate. After that, a third patterned conductor layer including a pixel electrode and an upper electrode is disposed on the passivation layer.

13 Claims, 12 Drawing Sheets

ACTIVE DEVICE ARRAY SUBSTRATE

CROSS-REFERENCE TO RELATED APPLICATION

This application is a continuation application of and claims the priority benefit of patent application Ser. No. 12/559,506, filed on Sep. 15, 2009, now allowed. The prior patent application Ser. No. 12/559,506 also claims the priority benefit of Taiwan Patent Application No. 98112811, filed on Apr. 17, 2009. The entirety of each of the above-mentioned patent applications is hereby incorporated by reference herein and made a part of this specification.

BACKGROUND OF THE INVENTION

1. Field of the Invention

The present invention relates to a method for fabricating an active device array substrate, and particularly to a method for fabricating an active device array substrate which reduces a number of photolithography and etching processes (PEPs) required.

2. Description of Related Art

Generally, a conventional method of fabricating a pixel structure of a liquid crystal display (LCD) panel includes five photolithography and etching processes (PEP). The first PEP is used to define a pattern of a first metal layer, so as to form a scan lines and gate electrodes of an active device. The second PEP is used to define patterns of a channel layer and an ohmic contact layer of the active device. The third PEP is used to define a pattern of a second metal layer, so as to form data lines and a source electrode and a drain electrode of the active device. The fourth PEP is used to pattern a passivation layer above the second metal layer, so as to form a contact window in the passivation layer. The fifth PEP is used to pattern an electrode material layer, so as to form the pixel electrode.

In order to enhance display quality of LCDs, many LCDs incorporate photo-sensors which sense light. Generally, photo-sensors integrated in LCDs are usually used to sense ambient light, so that the LCDs adequately adjust displayed brightness according to intensities of ambient light while displaying. In another application, the photo-sensor may be used as a sensing device of an optical touch panel. When a user uses a finger or another object (such as a stylus) to touch the optical touch panel, the photo-sensor integrated in the LCD panel senses changes in the intensity of light and outputs corresponding signals to provide touch functions. Under circumstances where the photo-sensors are disposed densely enough, the photo-sensors may be used in fingerprint identification and image scanning.

In recent years, disposition of photo-sensors have become gradually integrated in the LCD panels. However, when the photo-sensors are to be fabricated on the active device array substrates, PEP number required during fabrication increases, thereby lowering competitiveness of products.

SUMMARY OF THE INVENTION

The present invention is directed to a method for fabricating an active device array substrate having at least one photo-sensor, and fabrication of the photo-sensor thereof does not additionally increase PEP number.

The present invention relates to a method for fabricating an active device array substrate having at least one photo-sensor.

The present invention provides a method for fabricating an active device array substrate, and the method includes following steps. First, a substrate having a display area and a sensing area is provided, and a first patterned conductor layer is formed on the display area of the substrate. A gate insulator is formed on the substrate, so as to cover the first patterned conductor layer. A patterned semiconductor layer, a second patterned conductor layer and a patterned photosensitive dielectric layer are formed on the gate insulator, wherein the second patterned conductor layer includes a source electrode, a drain electrode and a lower electrode, the source electrode and the drain electrode are disposed in the display area and cover a part of the patterned semiconductor layer, the lower electrode is disposed in the sensing area, and the patterned photosensitive dielectric layer covers the second patterned conductor layer. The patterned photosensitive dielectric layer includes an interface protection layer disposed on the source electrode and the drain electrode and a photo-sensing layer disposed on the lower electrode. A passivation layer is formed on the substrate, wherein the passivation layer has a first contact window to expose one of the source electrode and the drain electrode and a second contact window to expose the photo-sensing layer. A third patterned conductor layer is formed on the passivation layer, wherein the third patterned conductor layer includes a pixel electrode and an upper electrode, and the pixel electrode is electrically connected to one of the source electrode and the drain electrode through the first contact window. The upper electrode covers the photo-sensing layer through the second contact window.

According to an embodiment of the present invention, a patterned heavily doped semiconductor layer is included between the above-mentioned patterned semiconductor layer and the second patterned conductor layer.

According to an embodiment of the present invention, the method of forming the first patterned conductor layer includes following steps. First, a first conductor material layer is formed on the substrate. Next, the first conductor material layer is patterned, so as to form a plurality of scan lines and a plurality of gate electrodes connected to the scan lines.

According to an embodiment of the present invention, when the first patterned conductor layer forms the scan lines and the gate electrodes, a step of forming a plurality of first bonding pads connected to ends of the scan lines is further included.

According to an embodiment of the present invention, when the above-mentioned first patterned conductor layer forms the first contact window and the second contact window, a step of forming a plurality of third contact windows in the gate insulator and the passivation layer so as to expose the first bonding pads is further included, and a part of the third patterned conductor is electrically connected to the first bonding pads through the third contact windows.

According to an embodiment of the present invention, the above-mentioned method of forming the second patterned conductor layer includes following steps. First, a second conductor material layer is formed on the substrate. The second conductor material layer is patterned, so as to form the source electrode, the drain electrode and the lower electrode on the substrate.

According to an embodiment of the present invention, when forming the above-mentioned source electrode, the drain electrode and the lower electrode, a step of forming data lines connected to the source electrode is further included.

According to an embodiment of the present invention, when forming the above-mentioned source electrode, the drain electrode, the lower electrode and the data lines, a step of forming second bonding pads connected to ends of the data lines is further included.

According to an embodiment of the present invention, when forming the above-mentioned first contact windows and second contact window, a step of forming a plurality of forth contact windows in the passivation layer so as to expose the second bonding pads is further included, and a part of the third patterned conductor layer is electrically connected to the second bonding pads through the fourth contact windows.

According to an embodiment of the present invention, the above-mentioned passivation layer includes an inorganic protection layer and an organic protection layer disposed on the inorganic protection layer, and the method of forming the first contact window and the second contact window includes following steps. First, the organic protection layer is patterned to form a patterned organic protection layer, and by using the patterned organic protection layer as a mask, the inorganic protection layer, a part of the interface protection layer on the source electrode and the drain electrode and a part of the gate insulator are removed. Furthermore, a thickness of the patterned organic protection layer is reduced until the inorganic protection layer on the photo-sensing layer is exposed. Then, by using the patterned organic protection layer having a reduced thickness as a mask, the inorganic protection layer on the photo-sensing layer is removed, so as to expose the photo-sensing layer.

According to an embodiment of the present invention, the method for reducing the thickness of the patterned organic protection layer includes plasma ashing.

According to an embodiment of the present invention, the method for forming the patterned semiconductor layer, the second patterned conductor layer and the patterned photosensitive dielectric layer includes following steps. A semiconductor material layer, a second conductor material layer and a photosensitive dielectric material layer are sequentially formed on the gate insulator; A patterned photoresist layer is formed on the photosensitive dielectric material layer, wherein the patterned photoresist layer has a plurality of second openings, the patterned photoresist layer includes a third block and a fourth block, and a thickness of the third block is greater than a thickness of the fourth block. By using the patterned photoresist layer as a mask, a part of the semiconductor material layer, the second conductor material layer and the photosensitive dielectric material layer are removed, so as to simultaneously form the source electrode, the drain electrode, the lower electrode, the photo-sensing layer and the interface protection layer. Last, the patterned photoresist layer is removed.

According to an embodiment of the present invention, the method of simultaneously forming the source electrode, the drain electrode, the lower electrode, the photo-sensing layer and the interface protection layer includes following steps. By using the patterned photoresist layer as a mask, a part of the semiconductor material layer, the second conductor material layer and the photosensitive dielectric material layer are removed, so as to form the lower electrode and the photo-sensing layer. The thickness of the patterned photoresist layer is reduced until the fourth block is removed. By using the second patterned photoresist layer having a reduced thickness as a mask, a part of the second conductor material layer and the photosensitive dielectric material layer are removed, so as to form the source electrode, the drain electrode and the interface protection layer.

According to an embodiment of the present invention, when forming the lower electrode and the photo-sensing layer, a step of forming a pad layer between the lower electrode and the gate insulator is further included.

The present invention provides a method for fabricating an active device array substrate, and the method includes following steps. First, a substrate having a display area and a sensing area is provided, and a first patterned conductor layer is formed on the display area of the substrate. A gate insulator is formed on the substrate, so as to cover the first patterned conductor layer. A patterned semiconductor layer is formed on the gate insulator, wherein the patterned semiconductor layer is disposed above the first patterned conductor layer. A second patterned conductor layer and a patterned photosensitive dielectric layer are formed on the patterned semiconductor layer, wherein the second patterned conductor layer includes a source electrode, a drain electrode and a lower electrode, the source electrode and the drain electrode are disposed in the display area and cover a part of the patterned semiconductor layer, the lower electrode is disposed in the sensing area, and the patterned photosensitive dielectric layer covers the second patterned conductor layer. The patterned photosensitive dielectric layer includes an interface protection layer disposed on the source electrode and the drain electrode and a photo-sensing layer disposed on the lower electrode. A passivation layer is formed on the substrate, wherein the passivation layer has a first contact window to expose one of the source electrode and the drain electrode, and a second contact window to expose the photo-sensing layer. A third patterned conductor layer is formed on the passivation layer, wherein the third patterned conductor layer includes a pixel electrode and an upper electrode, and the pixel electrode is electrically connected to one of the source electrode and the drain electrode through the first contact window. The upper electrode covers the photo-sensing layer through the second contact window.

According to an embodiment of the present invention, a patterned heavily doped semiconductor layer is included between the above-mentioned patterned semiconductor layer and the second patterned conductor layer.

According to an embodiment of the present invention, the method of forming the first patterned conductor layer includes following steps. First, a first conductor material layer is formed on the substrate. The first conductor material layer is patterned, so as to form a plurality of scan lines and a plurality of gate electrodes connected to the scan lines.

According to an embodiment of the present invention, when the scan lines and the gate electrodes are formed, a step of forming a plurality of first bonding pads connected to ends of the scan lines is further included.

According to an embodiment of the present invention, when the above-mentioned first contact window and the second contact window are formed, a step of forming a plurality of third contact windows in the gate insulator and the passivation layer so as to expose the first bonding pads is further included, and a part of the third patterned conductor layer is electrically connected to the first bonding pads through the third contact windows.

According to an embodiment of the present invention, the above-mentioned method of forming the second patterned conductor layer includes following steps. First, a second conductor material layer is formed on the substrate. The second conductor material layer is patterned, so as to form the source electrode, the drain electrode and the lower electrode on the substrate.

According to an embodiment of the present invention, when forming the above-mentioned source electrode, the drain electrode and the lower electrode, a step of forming data lines connected to the source electrode is further included.

According to an embodiment of the present invention, when forming the above-mentioned source electrode, the drain electrode, the lower electrode and the data lines, a step of forming second bonding pads connected to ends of the data lines is further included.

According to an embodiment of the present invention, when forming the above-mentioned first contact window and second contact window, a step of forming a plurality of forth contact windows in the passivation layer so as to expose the second bonding pads is further included, and a part of the third patterned conductor layer is electrically connected to the second bonding pads through the fourth contact windows.

According to an embodiment of the present invention, the above-mentioned passivation layer includes an inorganic protection layer and an organic protection layer disposed on the inorganic protection layer, and the method of forming the first contact window and the second contact window includes following steps. The organic protection layer is patterned to form a patterned organic protection layer, and by using the patterned organic protection layer as a mask, the inorganic protection layer, a part of the interface protection layer on the source electrode and the drain electrode and a part of the gate insulator are removed. A thickness of the patterned organic protection layer is reduced until the inorganic protection layer on the photo-sensing layer is exposed. By using the patterned organic protection layer having a reduced thickness as a mask, the inorganic protection layer on the photo-sensing layer is removed, so as to expose the photo-sensing layer.

According to an embodiment of the present invention, the method for reducing the thickness of the patterned organic protection layer includes plasma ashing.

According to an embodiment of the present invention, the above-mentioned method of forming the patterned semiconductor layer includes following steps. A patterned semiconductor material layer is formed on the gate insulator.

According to an embodiment of the present invention, the method for forming the second patterned conductor layer and the patterned photosensitive dielectric layer includes following steps. A second conductor material layer and a photosensitive dielectric material layer are sequentially formed on the patterned semiconductor layer. The second conductor material layer and the photosensitive dielectric material layer are patterned.

Due to the above, the method for fabricating the active device array substrate of the present invention effectively integrates fabrication of the photo-sensor, and is accordingly compatible with current fabrication processes.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Note that detailed structures provided in the following embodiments as examples can all be combined, replaced, or omitted under reasonable circumstances, so as to comply with actual demands. After referring to the descriptions in the following embodiments, a person having ordinary skill in the art should be able to comprehend the spirit and features of the present invention and make practical modifications and applications without departing from the spirit of the invention and in a manner consistent with the scope of the invention. Besides, to facilitate illustration and comprehension of the disclosure, same reference numbers are used to represent same or similar elements, and repetitive explanation is likely to be omitted.

FIGS. 1A to 1L are schematic cross-sectional views showing a fabricating process of an active device array substrate according to an embodiment of the present invention. For convenience of illustration, FIGS. 1A to 1L only show a partial cross-section of the active device array substrate for representation.

Figure 1A:
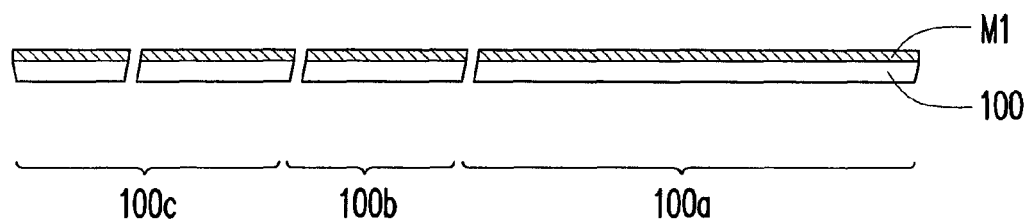
FIGS. 1A to 1L show methods for fabrication according to an embodiment of the present invention.

Please refer to FIG. 1A, a substrate 100 is provided. The substrate 100 has a display area 100a and a sensing area 100b. In the present embodiment, the substrate 100 may further include a peripheral circuit area 100c. A material of the substrate 100 may be an inorganic transparent material (for example glass, quartz, other suitable materials, or a combination thereof), an organic transparent material (for example polyolefins, polythioureas, polyalcohols, polyesters, rubber, thermoplastic polymers, thermosetting polymers, polyaromatics, polymethylmethacrylates, polycarbonates, other suitable materials, derivatives thereof, or a combination thereof), an inorganic opaque material (for example silica sheets, ceramic, other suitable materials, or a combination thereof), or a combination thereof.

Figure 1B:
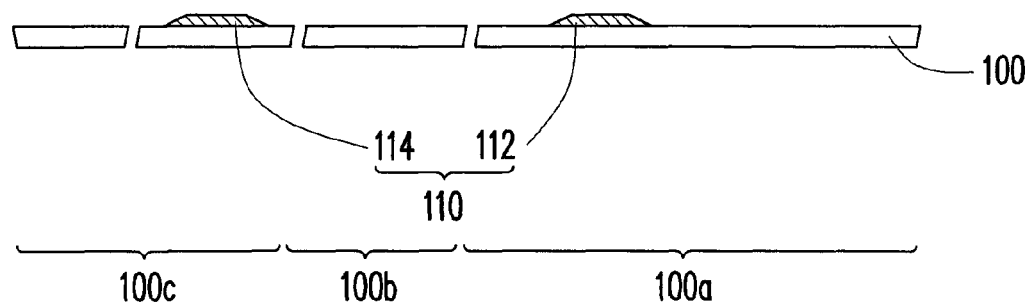

Referring to FIG. 1B, a first patterned conductor layer 110 is formed on the display area 100a of the substrate 100. In detail, in the present embodiment, the method of forming the first patterned conductor layer 110 includes following steps. First, a first conductor material layer M1 is formed on the substrate 100. Next, the first conductor material layer M1 is patterned, so as to form a plurality of scan lines (not shown) and a plurality of gate electrodes 112 connected to the scan lines on the substrate 100.

In the present embodiment, when forming the scan lines and the gate electrodes 112, a plurality of first bonding pads 114 connected ends of the scan lines may also be formed on the peripheral circuit area 100c of the substrate 100 simultaneously.

Referring to FIGS. 1C to 1F, a gate insulator 120 is formed on the substrate 100, so as to cover the first patterned conductor layer 110. Afterwards, a patterned semiconductor layer 130, a second patterned conductor layer 140 and a patterned photosensitive dielectric layer 150 are formed on the gate insulator 120. The second patterned conductor layer 140 includes a source electrode 142, a drain electrode 144 and a lower electrode 146, wherein the source electrode 142 and the drain electrode 144 are disposed in the display area 100a and cover a part of the patterned semiconductor layer 130, and the lower electrode 146 is disposed in the sensing area 100b. The patterned photosensitive dielectric layer 150 covers the second patterned conductor layer 140, and the patterned photosensitive dielectric layer 150 includes an interface protection layer 152 disposed on the source electrode 142 and the drain electrode 144 and a photo-sensing layer 154 disposed on the lower electrode 146. In the present embodiment, the gate insulator 120 may be a single layer or a multiple layer structure, and a material thereof is, for example, an inorganic material such as silicon oxide or silicon nitride, an organic material such as cycloolefins or a combination of the above. In addition, the patterned photosensitive dielectric layer 150 may be a silicon rich dielectric layer, for example a silicon rich oxide layer or a silicon rich nitride layer, or may be a layer of p-i-n diode, but is not limited thereto.

The following uses FIGS. 1C to 1F to provide detailed illustration of fabrication processes of the patterned semiconductor layer 130, the second patterned conductor layer 140 and the patterned photosensitive dielectric layer 150.

Figure 1C:
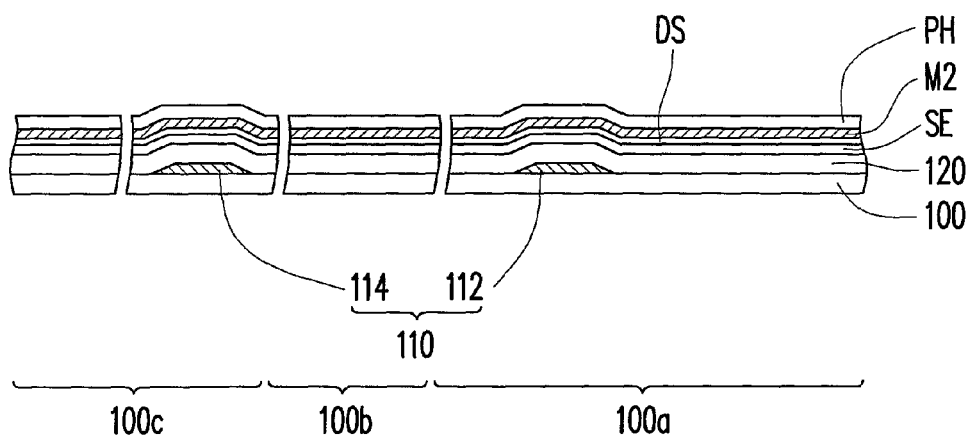

Referring to FIG. 1C, a semiconductor material layer SE, a second conductor material layer M2 and a photosensitive dielectric material layer PH are sequentially formed on the gate insulator 120. Next, please refer to FIGS. 1D and 1F. A patterned photoresist layer PR is formed on the photosensitive dielectric material layer PH, wherein the patterned photoresist layer PR has a plurality of second openings A, the patterned photoresist layer PR includes a third block S3 and a fourth block S4, and a thickness of the third block S3 is greater than a thickness of the fourth block S4. In detail, the patterned photoresist layer PR is formed by performing an exposure procedure on the photoresist layer using a half tone mask or a grey tone mask, wherein the half tone mask or the grey tone mask uses a mask having different transmittance to adjust exposure, so that the photoresist layer is exposed by different luminance, thereby a patterned photoresist layer having different thicknesses is formed after being developed.

Figure 1D:
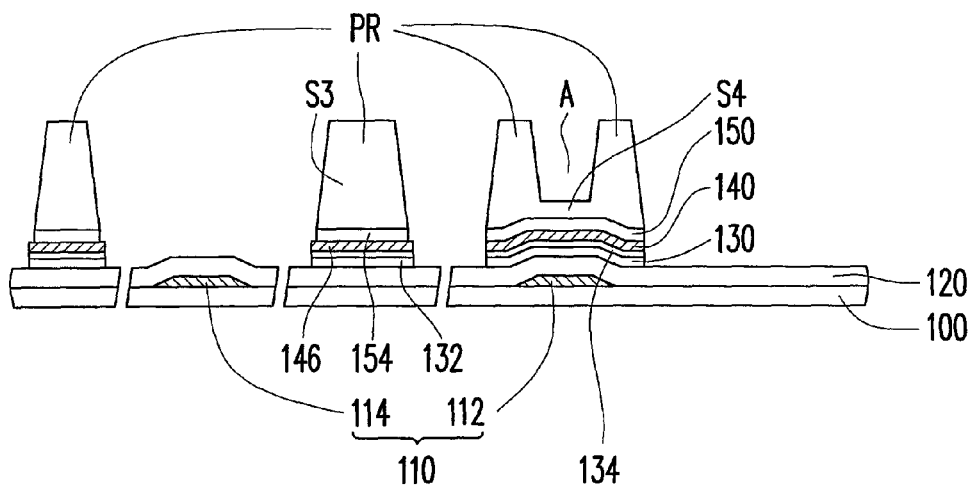
Figure 1E:
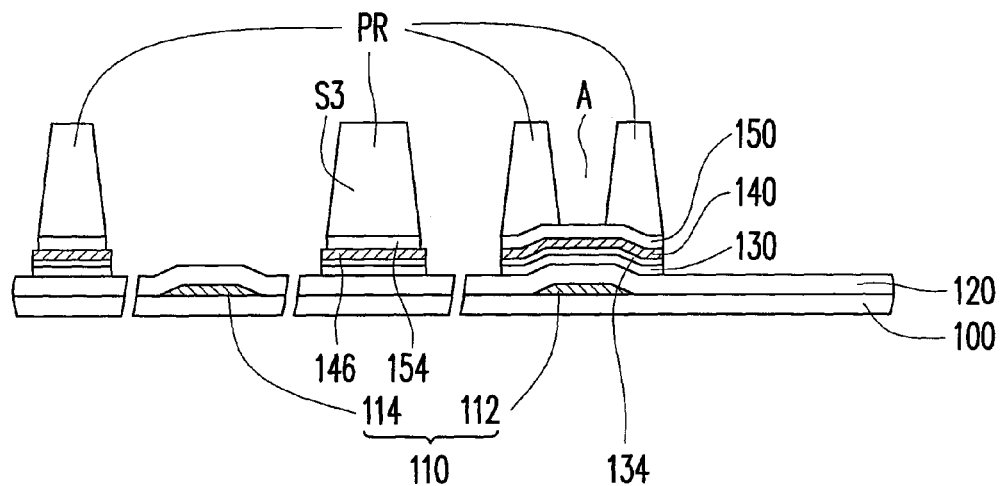
Figure 1F:
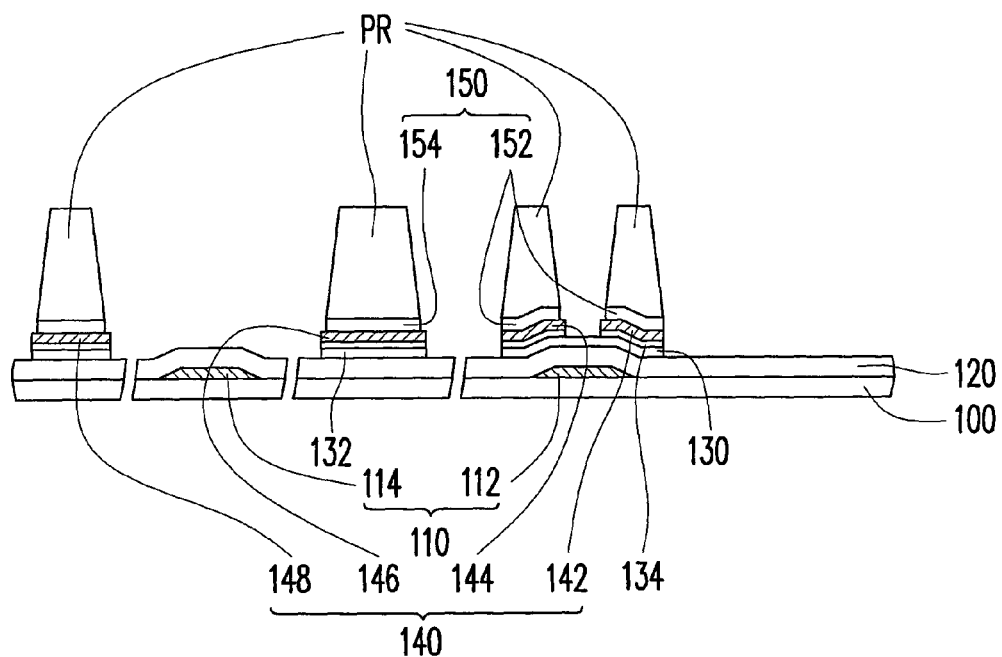
Figure 1G:
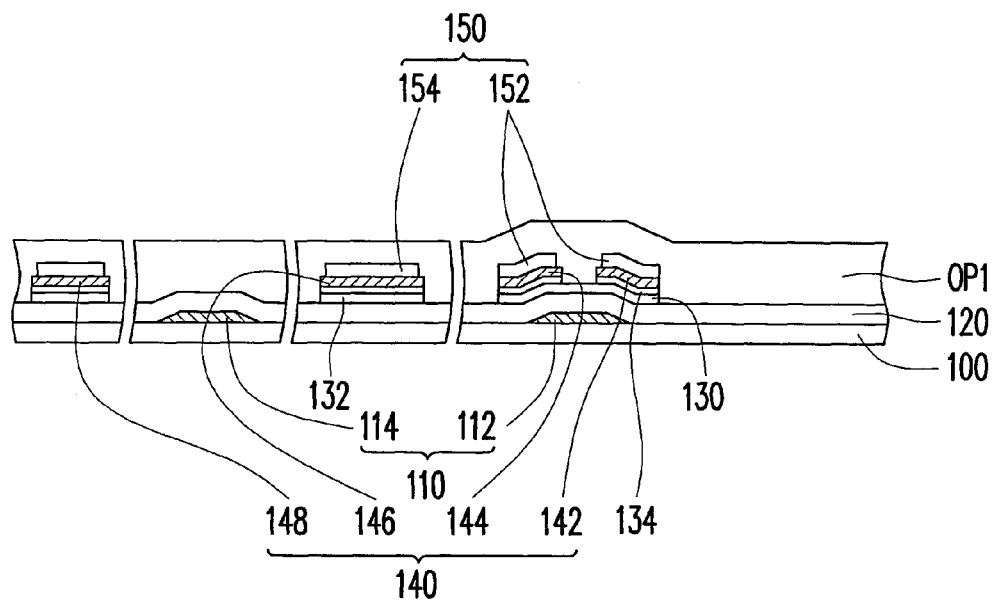

Then, by using the patterned photoresist layer PR as a mask, a part of the semiconductor material layer SE, the second conductor material layer M2 and the photosensitive dielectric material layer PH are removed, so as to simultaneously form the source electrode 142, the drain electrode 144, the lower electrode 146, the photo-sensing layer 154 and the interface protection layer 152, as shown in FIG. 1F. In the present embodiment, when forming the source electrode 142, the drain electrode 144 and the lower electrode 146, data lines (not shown) which are connected to the source electrode 142 and second bonding pads 148 which are connected to ends of the data lines are also formed. Last, the patterned photoresist layer PR is removed.

In the present embodiment, the method of simultaneously forming the source electrode 142, the drain electrode 144, the lower electrode 146, the photo-sensing layer 154 and the interface protection layer 152 includes following steps. First, by using the patterned photoresist layer PR as a mask, a part of the semiconductor material layer SE, the second conductor material layer M2 and the photosensitive dielectric material layer PH are removed, so as to form the lower electrode 146 and the photo-sensing layer 154, as shown in FIG. 1D. In the present embodiment, when forming the lower electrode 146 and the photo-sensing layer 154, a step of forming a pad layer 132 between the lower electrode 146 and the gate insulator 120 is further included. Then, a thickness of the patterned photoresist layer PR is reduced until the fourth block S4 is removed, as shown in FIG. 1E. In the present embodiment, the method for reducing the thickness of the patterned photoresist layer PR includes plasma ashing. Afterwards, by using the patterned photoresist layer PR having a reduced thickness as a mask, a part of the second conductor material layer SE and the photosensitive dielectric material layer PH are removed, so as to form the source electrode 142, the drain electrode 144 and the interface protection layer 152, as shown in FIG. 1F.

Please refer to FIGS. 1G to 1L. A passivation layer 160 is formed on the substrate 100. In the present embodiment, the passivation layer 160 includes an inorganic protection layer OP1 and an organic protection layer OP2 disposed on the inorganic protection layer OP1, wherein the inorganic protection layer OP1 covers the gate insulator 120, the patterned semiconductor layer 130, the second patterned conductor layer 140 and the patterned photosensitive dielectric layer 150.

Figure 1H:
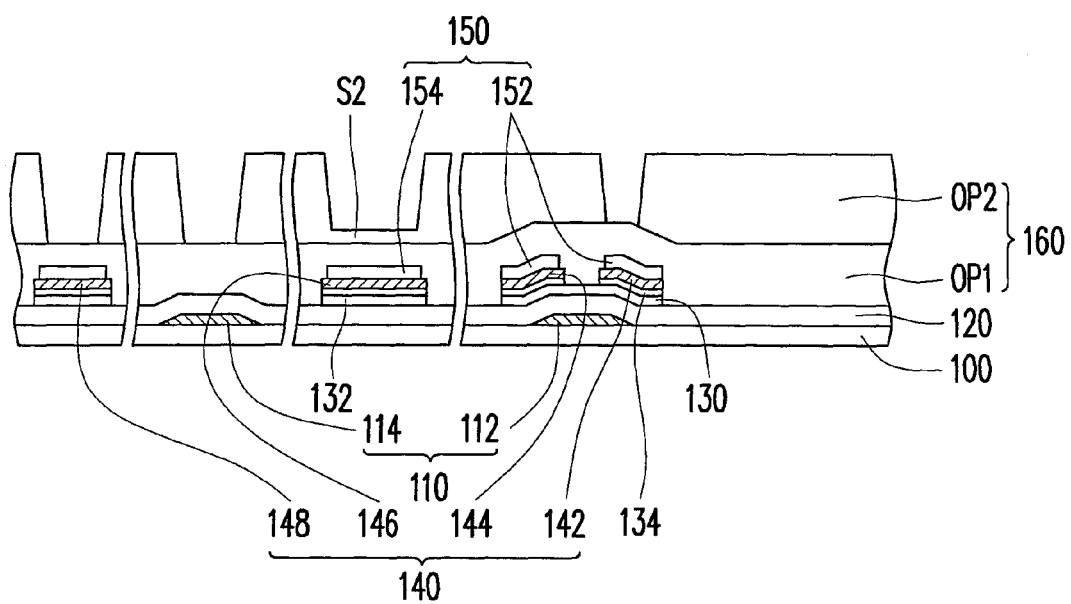
Figure 1I:
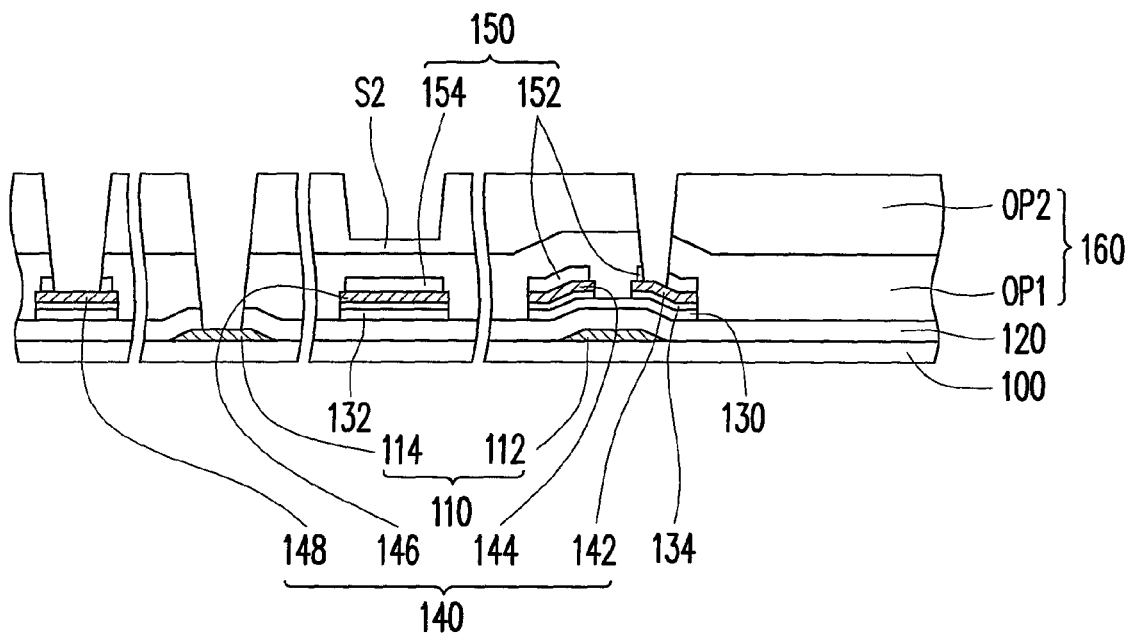
Figure 1J:
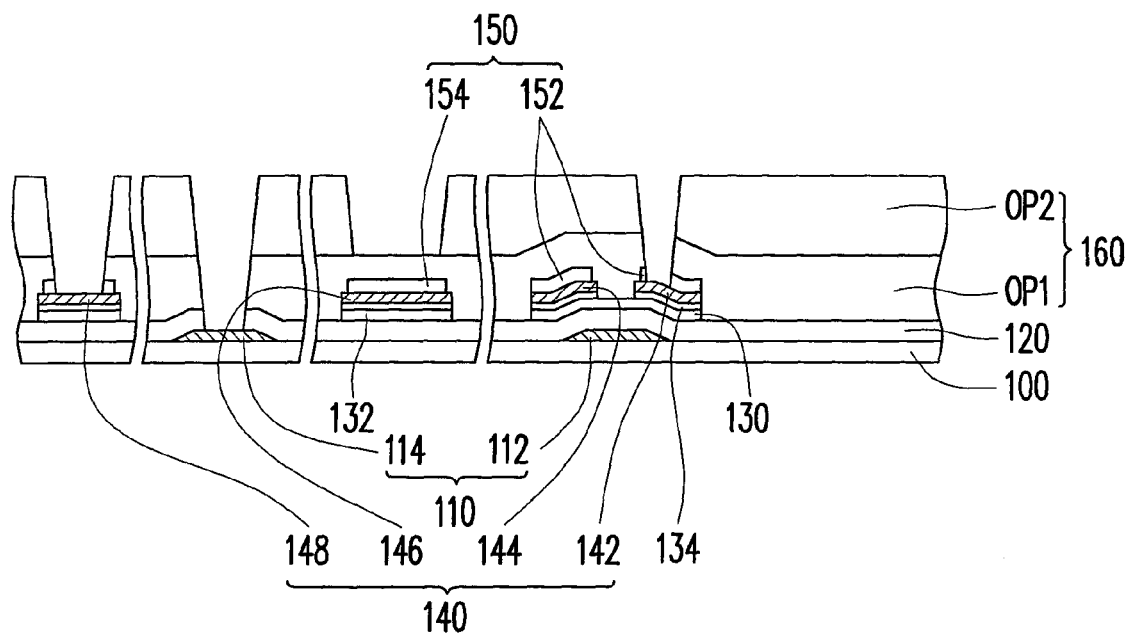
Figure 1K:
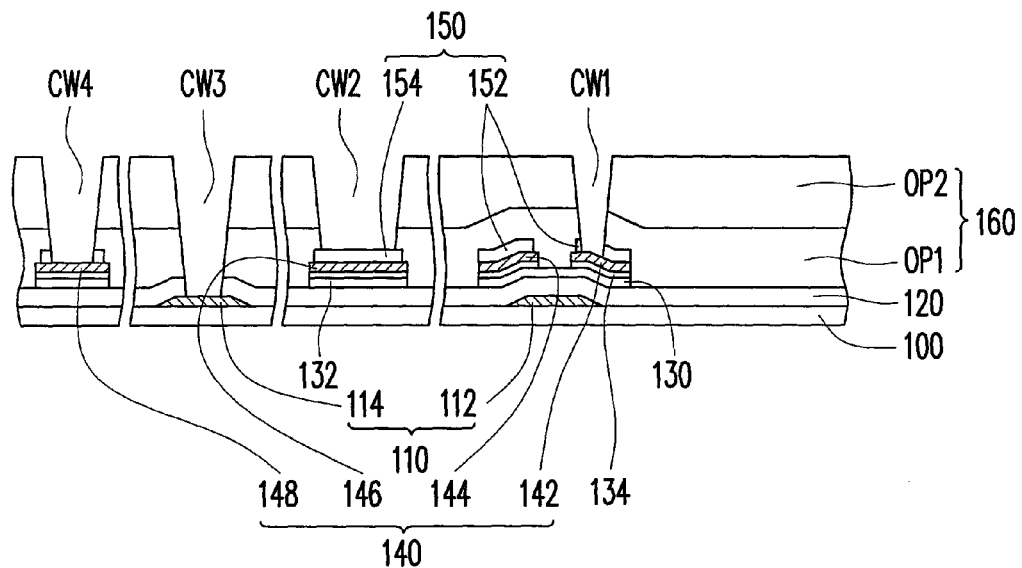

As known from FIG. 1K, the passivation layer 160 has a first contact window CW1 and a second contact window CW2, wherein the first contact window CW1 exposes one of the source electrode 142 and the drain electrode 144, and the second contact window CW2 exposes the photo-sensing layer 154. In the present embodiment, the method for forming the first contact window CW1 and the second contact window CW2 includes following steps. First, a patterned organic protection layer OP2 is formed on the inorganic protection layer OP1, as shown in FIG. 1H. Next, by using the patterned organic protection layer OP2 as a mask, the inorganic protection layer OP1, a part of the interface protection layer 152 and a part of the gate insulator 120 on the source electrode 142 and the drain electrode 144 are removed, as shown in FIG. 1I. Next, a thickness of the patterned organic protection layer OP2 is reduced until the block S2 having smaller thickness is removed and the inorganic protection layer OP1 on the photo-sensing layer 146 is exposed, as shown in FIG. 1J. In the present embodiment, the method for reducing the thickness of the patterned organic protection layer OP2 includes plasma ashing. Then, by using the patterned organic protection layer OP2 having a reduced thickness as a mask, the inorganic protection layer OP1 on the photo-sensing layer 146 is removed, so as to expose the photo-sensing layer 146, as shown in FIG. 1K.

Figure 1L:
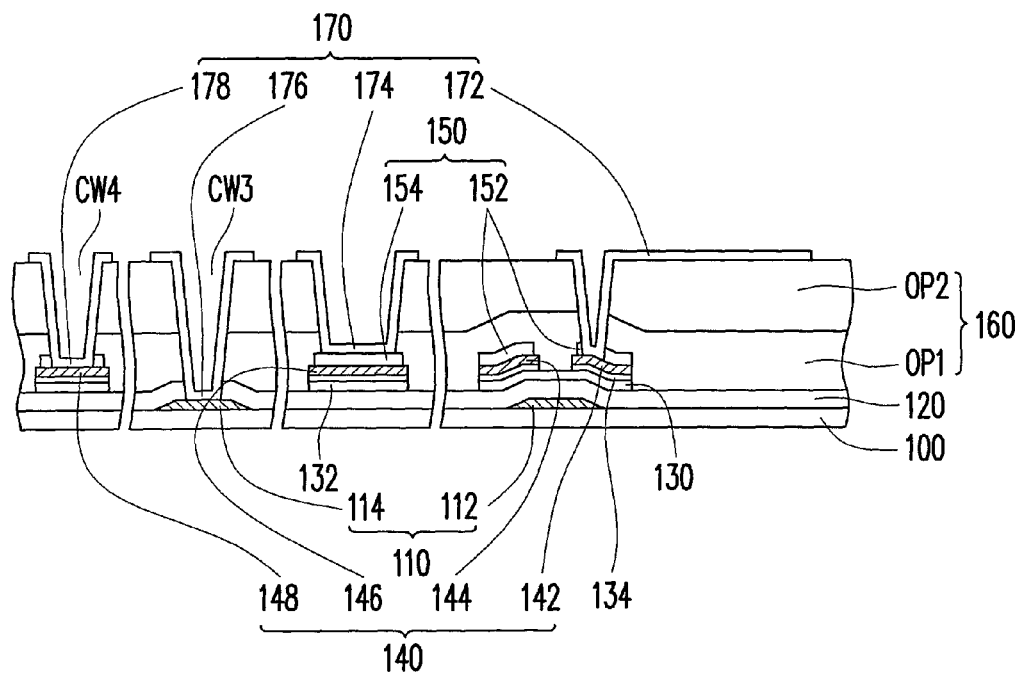

Next, please refer to FIG. 1L. A third patterned conductor layer 170 is formed on the patterned organic protection layer OP2. As known from FIG. 1L, the third patterned conductor layer 170 in the present embodiment includes a pixel electrode 172 and an upper electrode 174, wherein the pixel electrode 172 is electrically connected to one of the source electrode 142 and the drain electrode through the first contact window CW1, and the upper electrode 174 is electrically connected to the photo-sensing layer 154 though the second contact window CW2. For example, the third patterned conductor layer 170 may be fabricated through physical vapor deposition (PVD) and photolithographic and etching processes. In detail, according to the present embodiment, a material layer may first be formed through sputtering, evaporation and other thin film deposition techniques, and patterning processes of the material layer is then performed through photolithographic and etching processes. Accordingly, the third patterned conductor layer 170 including the pixel electrode 172 and the upper electrode 174 is fabricated.

In the present embodiment, a heavily doped semiconductor material layer DS is included between the above-mentioned semiconductor material layer SE and the conductor material layer M2, and a patterned heavily doped semiconductor layer 134 is included between the patterned semiconductor layer 130 and the second patterned conductor layer 140. In addition, according to the present embodiment, the patterned heavily doped semiconductor layer 134 is an ohmic contact layer.

In the present embodiment, when forming the first contact window CW1 and the second contact window CW2, a plurality of third contact windows CW3 which expose the first bonding pads 114 may be formed in the gate insulator 120 and the passivation layer 160, as shown in FIG. 1K. In addition, as known from FIG. 1L, the third patterned conductor layer 170 may further include a plurality of first bonding pad parts 176, and the first bonding pad parts 176 are electrically connected to the first bonding pads 114 through the third contact windows CW3.

In the present embodiment, when forming the first contact window CW1 and the second contact window CW2, a plurality of fourth contact windows CW4 which expose the second bonding pads 148 may be formed in the passivation layer 160, as shown in FIG. 1K. In addition, as known from FIG. 1L, the third patterned conductor layer 170 may further include a plurality of second bonding pad parts 178, and the second bonding pad parts 178 are electrically connected to the second bonding pads 148 through the fourth contact windows CW4.

FIGS. 2A to 2L are schematic cross-sectional views showing a fabricating process of an active device array substrate according to another embodiment of the present invention. For convenience of illustration, FIGS. 2A to 2L only show a partial cross-section of the active device array substrate for representation during illustration.

Figure 2A:
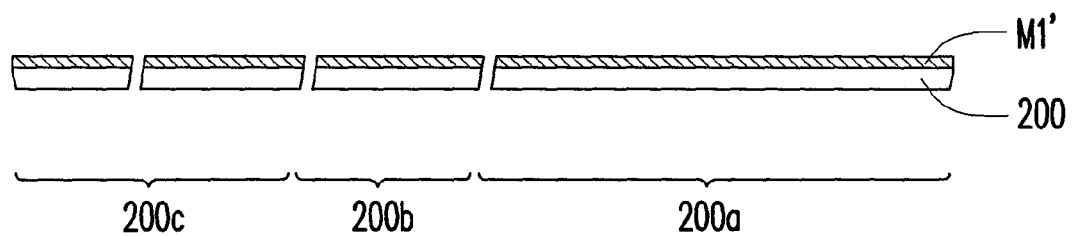
FIGS. 2A to 2L show methods for fabrication according to another embodiment of the present invention.

Please refer to FIG. 2A. A substrate 200 is provided. The substrate 200 has a display area 200a and a sensing area 100b. In the present embodiment, the substrate 200 may further include a peripheral circuit area 200c. A material of the substrate 200 may be an inorganic transparent material (for example glass, quartz, other suitable materials, or a combination thereof), an organic transparent material (for example polyolefines, polythioureas, polyalcohols, polyesters, rubber, thermoplastic polymers, thermosetting polymers, polyaromatics, polymethylmethacrylates, polycarbonates, other suitable materials, derivatives thereof, or a combination thereof), an inorganic opaque material (for example silica sheets, ceramic, other suitable materials, or a combination thereof), or a combination thereof.

Figure 2B:
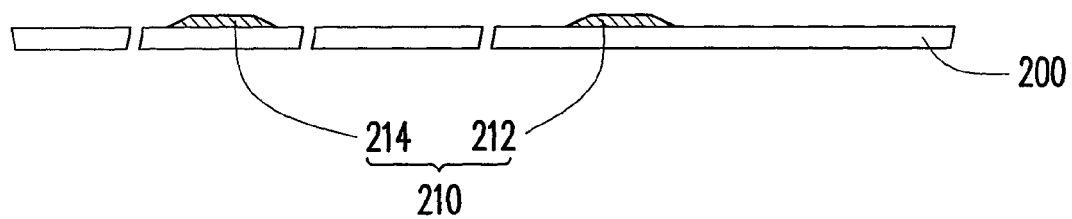

Next, please refer to FIG. 2B. A first patterned conductor layer 210 is formed on the display area 200a of the substrate 200. In detail, according to the present embodiment, the method of forming the first patterned conductor layer 210 includes following steps. First, a first conductor material layer M1' is formed on the substrate 200. Then the first conductor material layer M1' is patterned, so as to form a plurality of scan lines (not shown) and a plurality of gate electrodes 212 connected to the scan lines on the substrate 200.

In the present embodiment, when forming the scan lines and the gate electrodes 212, a plurality of first bonding pads 214 connected to ends of the scan lines may also be formed on the peripheral circuit area 200c of the substrate 200.

Next, please refer to FIGS. 2C to 2F. A gate insulator 220 is formed on the substrate 200, so as to cover the first patterned conductor layer 210. Then, a patterned semiconductor layer 230 is formed on the gate insulator 220, wherein the patterned semiconductor layer 230 is disposed above the first patterned conductor layer 220. Afterwards, a second patterned conductor layer 240 and a patterned photosensitive dielectric layer 250 are formed on the patterned semiconductor layer 230, wherein the second patterned conductor layer 240 includes a source electrode 242, a drain electrode 244 and a lower electrode 246. The source electrode 242 and the drain electrode 244 are disposed in the display area 200a and cover a part of the patterned semiconductor layer 230, and the lower electrode 246 is disposed in the sensing area 200b. The patterned photosensitive dielectric layer 250 covers the second patterned conductor layer 240, and the patterned photosensitive dielectric layer 250 includes an interface protection layer 252 disposed on the source electrode 242 and the drain electrode 244 and a photo-sensing layer 254 disposed on the lower electrode 246. In the present embodiment, the gate insulator 220 may be a single layer or a multiple layer structure, and a material thereof is, for example, an inorganic material such as silicon oxide or silicon nitride, an organic material such as cycloolefins or a combination of the above. In addition, the patterned photosensitive dielectric layer 250 may be a silicon rich dielectric layer, for example a silicon rich oxide layer, a silicon rich nitride layer, a silicon rich oxynitride layer, a silicon rich carbide layer, a silicon rich carboxide layer, or may be a layer of p-i-n diode, but is not limited thereto.

The following uses FIGS. 2C to 2F to provide detailed illustration of fabrication processes of the patterned semiconductor layer 230, the second patterned conductor layer 240 and the patterned photosensitive dielectric layer 250.

Figure 2C:
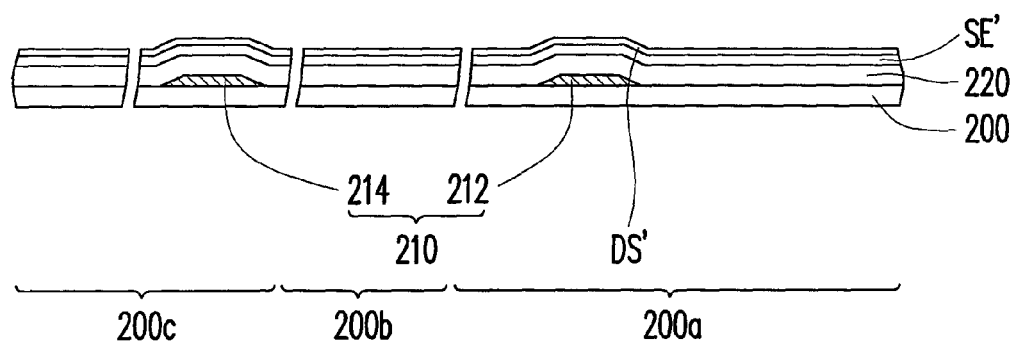
Figure 2D:
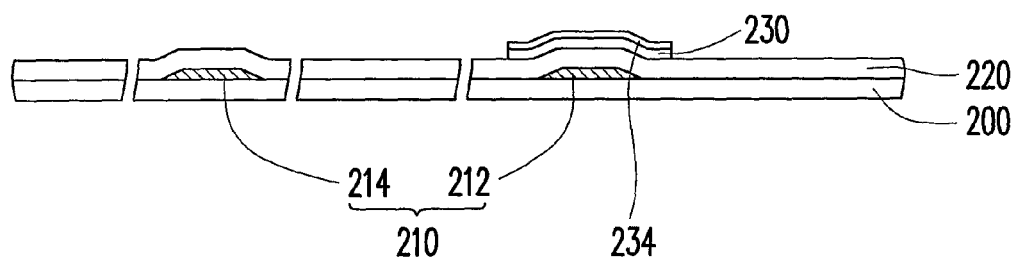
Figure 2E:
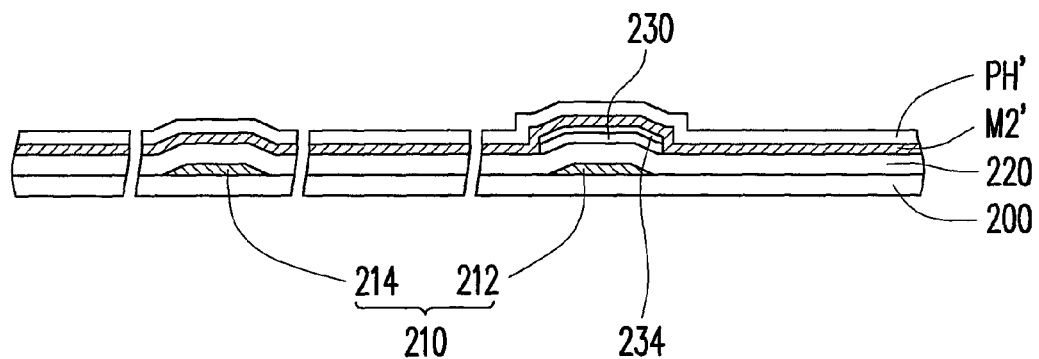
Figure 2F:
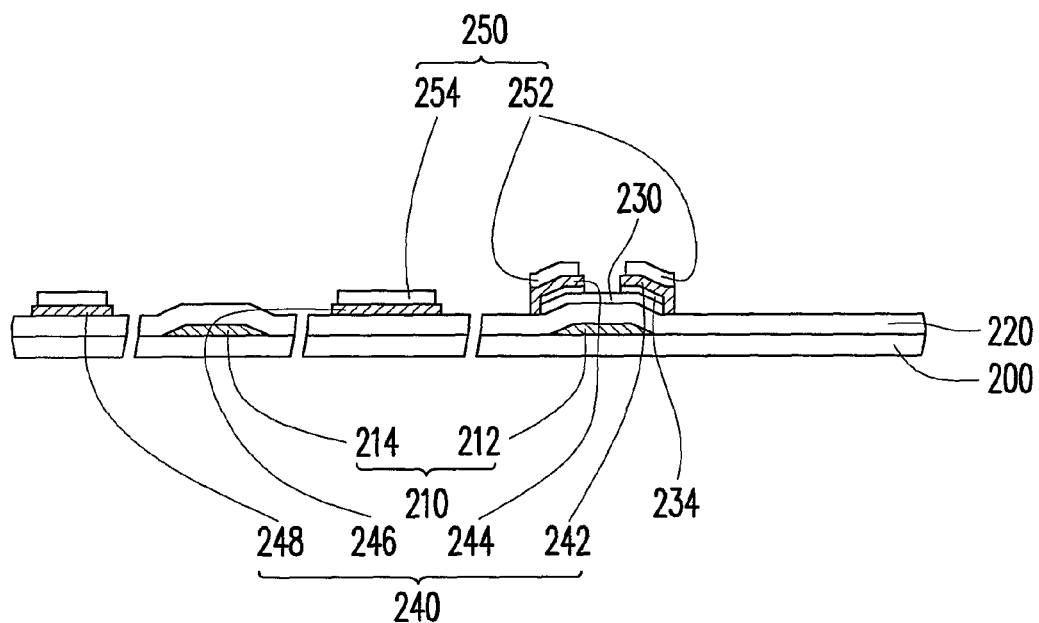
Figure 2G:
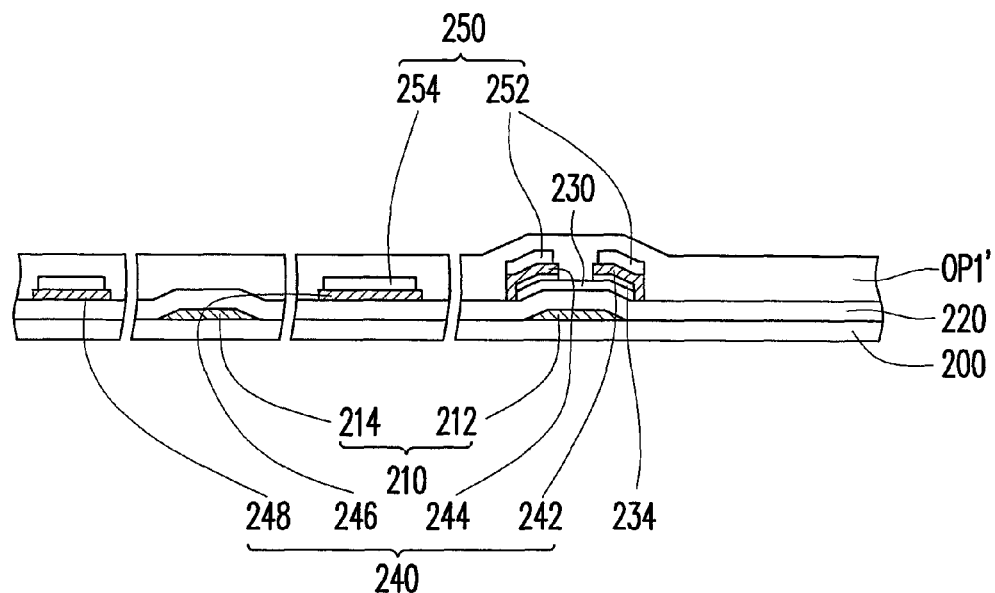

Please refer to FIGS. 2C and 2D. In the present embodiment, the method of forming the patterned semiconductor layer 230 includes forming a semiconductor material layer SE' on the gate insulator 220 and then patterning the semiconductor material layer SE', so as to form the patterned semiconductor layer 230 on the display area 200a of the substrate 200. Next, please refer to FIGS. 2E and 2F. A second conductor material layer M2' and a photosensitive dielectric material layer PH' are formed on the substrate 200. Then the second conductor material layer M2' and the photosensitive dielectric material layer PH' are patterned, so as to form a second patterned conductor layer 240 and a patterned photosensitive dielectric layer 250 on the display area 200a of the substrate 200 In the present embodiment, when patterning the second conductor material layer M2' to form the second patterned conductor layer 240, the source electrode 242, the drain electrode 244 and the lower electrode 246 are also simultaneously formed on the substrate 200, and data lines (not shown) connected to the source electrode 242 and second bonding pads 248 connected to ends of the data lines are further formed.

Please refer to FIGS. 2G to 2L. A passivation layer 260 is formed on the substrate 200. In the present embodiment, the passivation layer 260 includes an inorganic protection layer OP1' and an organic protection layer OP2' disposed on the inorganic protection layer OP1, wherein the inorganic protection layer OP1' covers the gate insulator 220, the patterned semiconductor layer 230, the second patterned conductor layer 240 and the patterned photosensitive dielectric layer 250.

Figure 2H:
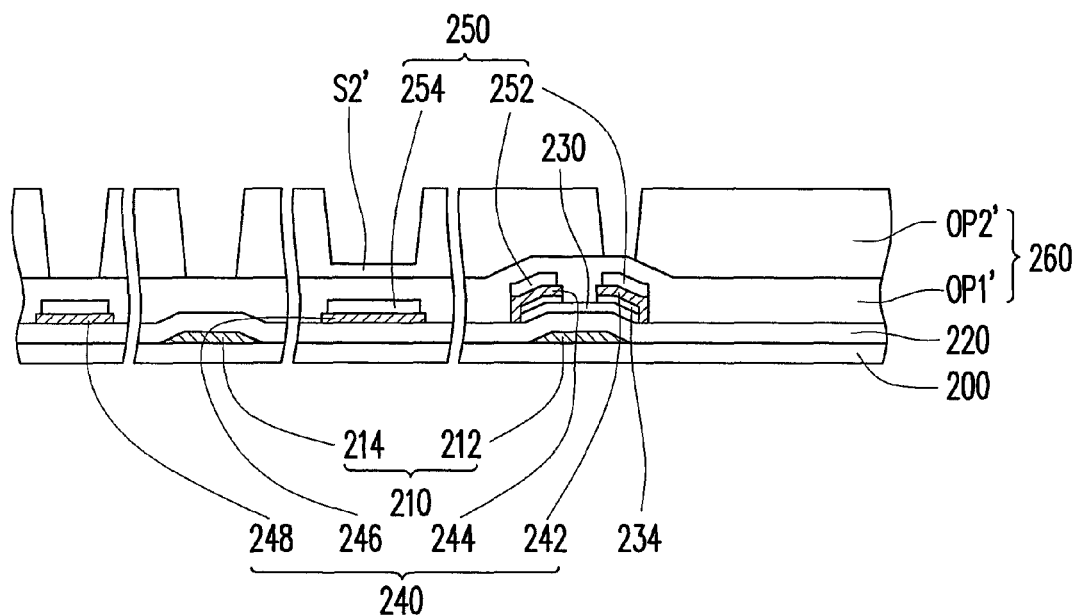
Figure 2I:
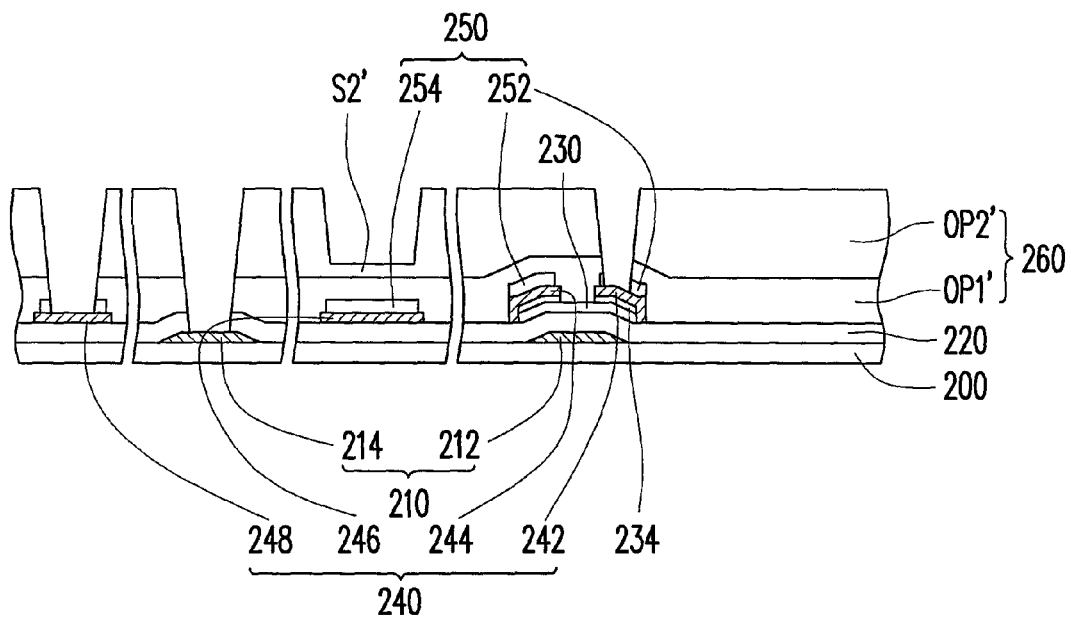
Figure 2J:
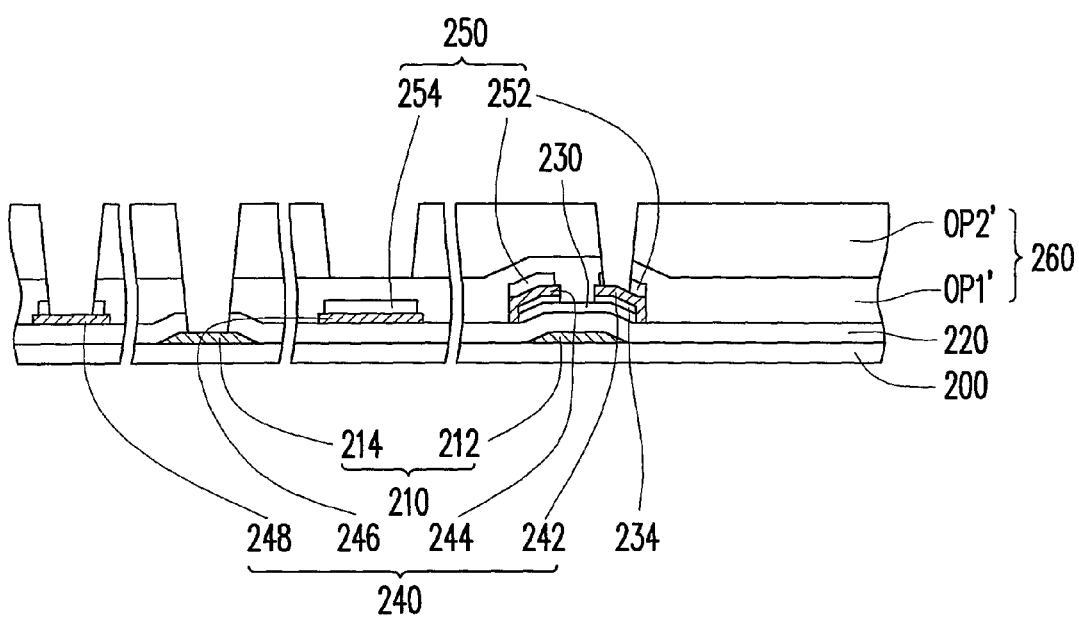
Figure 2K:
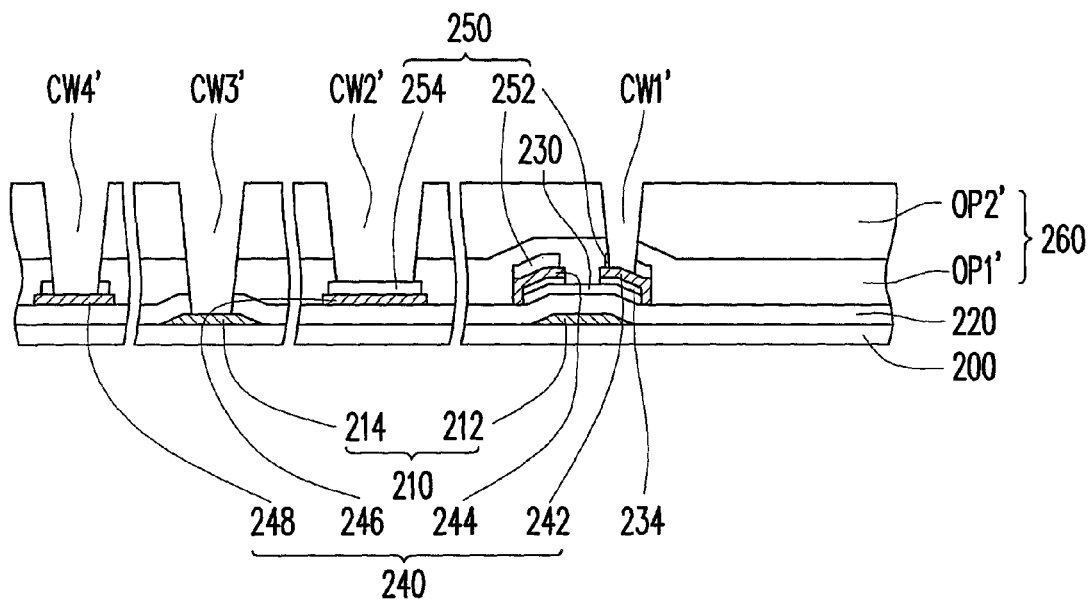

As known from FIG. 2K, the passivation layer 260 has a first contact window CW1' to expose one of the source electrode 242 and the drain electrode 244 and a second contact window CW2' to expose the photo-sensing layer 254. In the present embodiment, the method for forming the first contact window CW1' and the second contact window CW2' includes following steps. First, a patterned organic protection layer OP2' is formed on the inorganic protection layer OP1', as shown in FIG. 2H. Next, by using the patterned organic protection layer OP2' as a mask, the inorganic protection layer OP1', a part of the interface protection layer 252 and a part of the gate insulator 120 on the source electrode 242 and the drain electrode 244 are removed, as shown in FIG. 2I. Next, a thickness of the patterned organic protection layer OP2' is reduced until the block S2' having smaller thickness is removed and exposes the passivation layer 260 on the photo-sensing layer 246, as shown in FIG. 2J. In the present embodiment, the method for reducing the thickness of the patterned organic protection layer OP2' includes plasma ashing. Then, by using the patterned organic protection layer OP2' having a reduced thickness as a mask, the inorganic protection layer OP1' on the photo-sensing layer 246 is removed, so as to expose the photo-sensing layer 246, as shown in FIG. 2K.

Figure 2L:
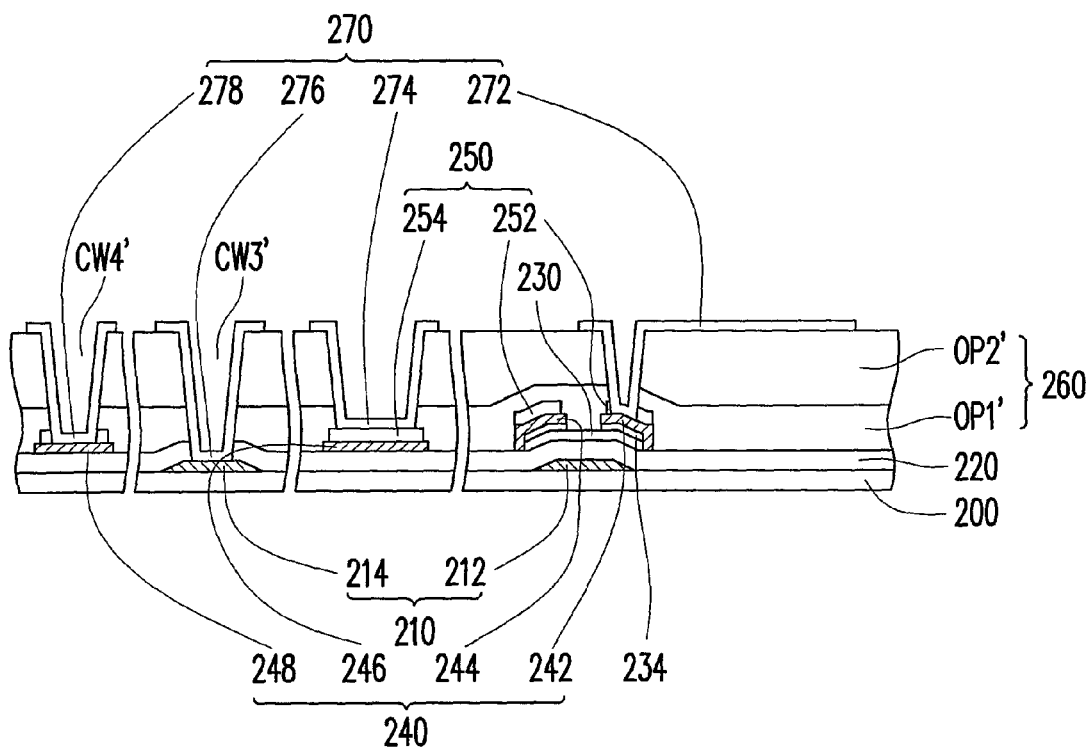

Next, please refer to FIG. 2L. A third patterned conductor layer 270 is formed on the passivation layer 260. As known from FIG. 2L, the third patterned conductor layer 270 in the present embodiment includes a pixel electrode 272 and an upper electrode 274, wherein the pixel electrode 272 is electrically connected to one of the source electrode 242 and the drain electrode 244 through the first contact window CW1', and the upper electrode 274 is electrically connected to the photo-sensing layer 254 though the second contact window CW2'. For example, the third patterned conductor layer 270 may be fabricated through physical vapor deposition (PVD) and photolithographic and etching processes. In detail, according to the present embodiment, a material layer may first be formed through sputtering, evaporation and other thin film deposition techniques, and patterning processes of the material layer is then performed through photolithographic and etching processes. Accordingly, the third patterned conductor layer 270 having including the pixel electrode 272 and the upper electrode 274 is fabricated.

In the present embodiment, a heavily doped semiconductor material layer DS' is included on the above-mentioned semiconductor material layer SE', and a patterned heavily doped semiconductor layer 234 is included between the patterned semiconductor layer 230 and the second patterned conductor layer 240. In addition, according to the present embodiment, the patterned heavily doped semiconductor layer 234 is an ohmic contact layer.

In the present embodiment, when forming the first contact window CW1' and the second contact window CW2', a plurality of third contact windows CW3' which expose the first bonding pads 214 may be formed in the gate insulator 220 and the passivation layer 260, as shown in FIG. 2K. In addition, as known from FIG. 2L, the third patterned conductor layer 270 may further include a plurality of first bonding pad parts 276, and the first bonding pad parts 276 are electrically connected to the first bonding pads 214 through the third contact windows CW3'.

In the present embodiment, when forming the first contact window CW1' and the second contact window CW2', a plurality of fourth contact windows CW4' which expose the second bonding pads 248 may be formed in the passivation layer 260, as shown in FIG. 2K. In addition, as known from FIG. 2L, the third patterned conductor layer 270 is electrically connected to the second bonding pads 248 through the fourth contact windows CW4'.

In summary, the method for fabricating the active device array substrate which integrates the photo-sensor does not additionally increase PEPs, so that compared with conventional art, the number of masks used is less, and fabrication costs are reduced. In addition, the photo-sensing layer and the source electrode and the drain electrode of the active device array substrate are formed in the same PEP, so that fabrication of the photo-sensor of the present invention is performed with lower cost, productivity is increased, and integration of products is enhanced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An active device array substrate, comprising:
a substrate having a display area and a photo sensing area;
a first patterned conductor layer disposed on the display area of the substrate;
a gate insulator disposed on the substrate to cover the first patterned conductor layer;
a patterned semiconductor layer disposed on the gate insulator;
a second patterned conductor layer comprising a source electrode, a drain electrode and a lower electrode, wherein the source electrode and the drain electrode are disposed in the display area and cover a part of the patterned semiconductor layer, and the lower electrode is disposed on the gate insulator in the photo sensing area of the substrate;
a patterned photosensitive silicon rich dielectric layer comprising an interface protection layer and a photo-sensing layer, wherein the interface protection layer is disposed on the source electrode and the drain electrode, and the photo-sensing layer is disposed on the lower electrode;
a passivation layer disposed on the substrate to cover the patterned photosensitive silicon rich dielectric layer and the gate insulator, wherein the passivation layer and patterned photosensitive silicon rich dielectric layer have a first contact window to expose one of the source electrode and the drain electrode, and the passivation layer has a second contact window to expose a portion of the photo-sensing layer; and
a third patterned conductor layer comprising a pixel electrode and an upper electrode, wherein the pixel electrode is electrically connected to one of the source electrode and the drain electrode through the first contact window, and the upper electrode covers the photo-sensing layer through the second contact window,
wherein the photo-sensing layer is sandwiched between the lower electrode and the upper electrode.

2. The active device array substrate of claim 1, wherein the first patterned conductor layer comprises a scan line and a gate electrode connected to the scan line.

3. The active device array substrate of claim 2, wherein the first patterned conductor layer further comprises a first bonding pad connected to an end of the scan line.

4. The active device array substrate of claim 3, wherein the gate insulator and the passivation layer further comprises a third contact window to expose the first bonding pad and a part of the third patterned conductor layer above the first bonding pad is electrically connected to the first bonding pad through the third contact window.

5. The active device array substrate of claim 1, wherein the second patterned conductor layer further comprises a data line connected to the source electrode.

6. The active device array substrate of claim 5, wherein the second patterned conductor layer further comprises a second bonding pad connected to an end of the data line.

7. The active device array substrate of claim 6, wherein the passivation layer further comprises a fourth contact window to expose the second bonding pad, and a part of the third patterned conductor layer above the second bonding pad is electrically connected to the second bonding pad through the fourth contact window.

8. The active device array substrate of claim 1, wherein the passivation layer comprises an inorganic protection layer and an organic protection layer disposed on the inorganic protection layer.

9. The active device array substrate of claim 1, further comprising a pad layer between the lower electrode and the gate insulator.

10. The active device array substrate of claim 1, further comprising a patterned heavily doped semiconductor layer is disposed between the patterned semiconductor layer and the second patterned conductor layer.

11. The active device array substrate of claim 1, wherein the patterned photosensitive silicon rich dielectric layer comprises a silicon rich oxide layer, a silicon rich nitride layer, a silicon rich oxynitride layer, a silicon rich carbide layer, a silicon rich carboxide layer.

12. The active device array substrate of claim 1, wherein the lower electrode, the photo-sensing layer of the patterned photosensitive silicon rich dielectric layer and the upper electrode construct a photo-sensor.

13. An active device array substrate, comprising:
a substrate having a display area and a photo sensing area;
a first patterned conductor layer disposed on the display area of the substrate;
a gate insulator disposed on the substrate to cover the first patterned conductor layer;
a patterned semiconductor layer disposed on the gate insulator;
a second patterned conductor layer comprising a source electrode, a drain electrode and a lower electrode, wherein the source electrode and the drain electrode are disposed in the display area and cover a part of the patterned semiconductor layer, and the lower electrode is disposed on the gate insulator in the photo sensing area of the substrate;
a patterned photosensitive silicon rich dielectric layer comprising an interface protection layer and a photo-sensing layer, wherein the interface protection layer is disposed on the source electrode and the drain electrode, and the photo-sensing layer is disposed on the lower electrode;
a passivation layer disposed on the substrate to cover the patterned photosensitive silicon rich dielectric layer and the gate insulator, wherein the passivation layer and patterned photosensitive silicon rich dielectric layer have a first contact window to expose one of the source electrode and the drain electrode, and the passivation layer has a second contact window to expose a portion of the photo-sensing layer; and
a third patterned conductor layer comprising a pixel electrode and an upper electrode, wherein the pixel electrode is electrically connected to one of the source electrode and the drain electrode through the first contact window, and the upper electrode covers the photo-sensing layer through the second contact window,
wherein the lower electrode, the photo-sensing layer of the patterned photosensitive silicon rich dielectric layer and the upper electrode construct a photo-sensor.

* * * * *